United States Patent

[11] 3,612,749

[72] Inventors Franklin F. Grube, Jr.
Westchester;
Michael J. McMahon, Maywood, both of Ill.

[21] Appl. No. 852,761

[22] Filed Aug. 25, 1969

[45] Patented Oct. 12, 1971

[73] Assignee Motorola, Inc.
Franklin Park, Ill.

[54] RESILIENT MOUNTING SUPPORT FOR PLURALITY OF ELECTRICAL DEVICES, SUCH AS PIEZOELECTRIC CRYSTALS
2 Claims, 6 Drawing Figs.

[52] U.S. Cl. .......... 174/138 G, 248/27, 310/9.1, 317/99

[51] Int. Cl. .......... H01b 3/46, H01v 7/00

[50] Field of Search .......... 174/138 G, 153 G; 248/27, 309, 314; 317/101 C, 101 CC, 99; 310/9.1

[56] References Cited

UNITED STATES PATENTS

| | | | |
|---|---|---|---|
| 2,829,426 | 4/1958 | Franklin | 317/101 X |
| 2,862,992 | 12/1958 | Franz | 174/52 .6 |
| 2,891,103 | 6/1959 | Swengel | 174/52.6 |
| 3,087,982 | 4/1963 | Hayes | 174/138.5 |
| 3,289,145 | 11/1966 | Ruehlemann | 174/153 G |
| 3,343,365 | 9/1967 | Vosseler | 310/9.1 |

*Primary Examiner*—Lewis H. Myers
*Assistant Examiner*—Gerald P. Tolin
*Attorney*—Mueller and Aichele

ABSTRACT: Resilient mounting support for electrical devices, such as piezoelectric crystals, for mounting the same on the chassis of electrical apparatus, such as a radio transmitter and/or receiver. The support includes a block of resilient material having cavities therein for receiving the containers for the devices, and integral mounting tabs for securing the block to the chassis.

The block may be positioned in an opening in the chassis and the mounting tabs may have projections extending in other openings with interlocking projections to hold the same in position. The support may be formed of transparent silicone rubber to protect the devices against shock and vibration and to permit inspection of identifications on the containers through the mounting support.

PATENTED OCT 12 1971 3,612,749

Inventors
FRANKLIN F. GRUBE JR.
MICHAEL J. McMAHON
BY
Mueller, Aichele & Rauner
ATTYS.

RESILIENT MOUNTING SUPPORT FOR PLURALITY OF ELECTRICAL DEVICES, SUCH AS PIEZOELECTRIC CRYSTALS

BACKGROUND OF THE INVENTION

Piezoelectric crystals are commonly used in radio equipment to determine the frequency of oscillators or other selective circuits. It is common practice to provide the crystals in containers with connecting pins which also provide plug-in mechanical and electrical connections for supporting the crystals on a chassis. In such case the vibration and shock encountered by the chassis are transmitted through the mechanical connecting pins to the crystal within the container. This may damage the crystal and/or affect the operation thereof.

It is becoming more common to provide radios operable on a plurality of frequencies, and to establish such frequencies separate crystals are required. Accordingly the radio equipment may include a relatively large number of crystals, and to provide a separate mounting for each crystal requires substantial space and significant cost. Components other than crystals may also require protection against shock and vibration.

SUMMARY OF THE INVENTION

It is an object of the present invention to provide a mounting support for an electrical device used on a chassis which encounters shock and vibration, for protecting such device. A further object of the invention is to provide a supporting structure providing a resilient mounting for receiving and supporting a plurality of electrical devices.

Another object of the invention is to provide a resilient support for piezoelectric crystals which are enclosed in containers, which includes integral provisions for securing the same to a chassis, and which isolates the crystals from shock and vibration of the chassis.

A feature of the invention is the provision of a mounting structure for components, such as a piezoelectric crystal, which includes a block of resilient material having cavities therein for receiving the components, with walls of the resilient material defining the cavities and positioned between the devices. The cavities have substantial depth for receiving the containers and enclose a substantial part of the surface thereof.

Another feature of the invention is the provision of a resilient support for a plurality of crystals or other components, including a block of resilient material which is positioned in an opening in the chassis, and has a rim engaging the chassis and mounting tabs with projections thereon extending through openings in the chassis to provide locking connections to secure the support to the chassis. The resilient material may be transparent silicone rubber.

In practicing the invention, a mounting structure for electrical components is molded from silicone rubber in the form of a block having a plurality of cavities therein, and with a rim about the block and mounting tabs extending therefrom with projections thereon. The structure is supported on a chassis for electrical equipment, such as a radio transmitter and/or receiver, with the chassis having an opening into which the block extends. The chassis may also have further openings for receiving projections on the mounting tabs, and the tabs may have enlarged portions which are compressed to be inserted therethrough and which provide interlocking engagement with the chassis. The block of material, mounting tabs and projections are integrally molded of silicone rubber, which may be transparent to permit observation of identifications on the crystals without removing the same from the support.

DESCRIPTION OF THE PREFERRED EMBODIMENT

Figures 1, 2, 3, 4, 5, 6:
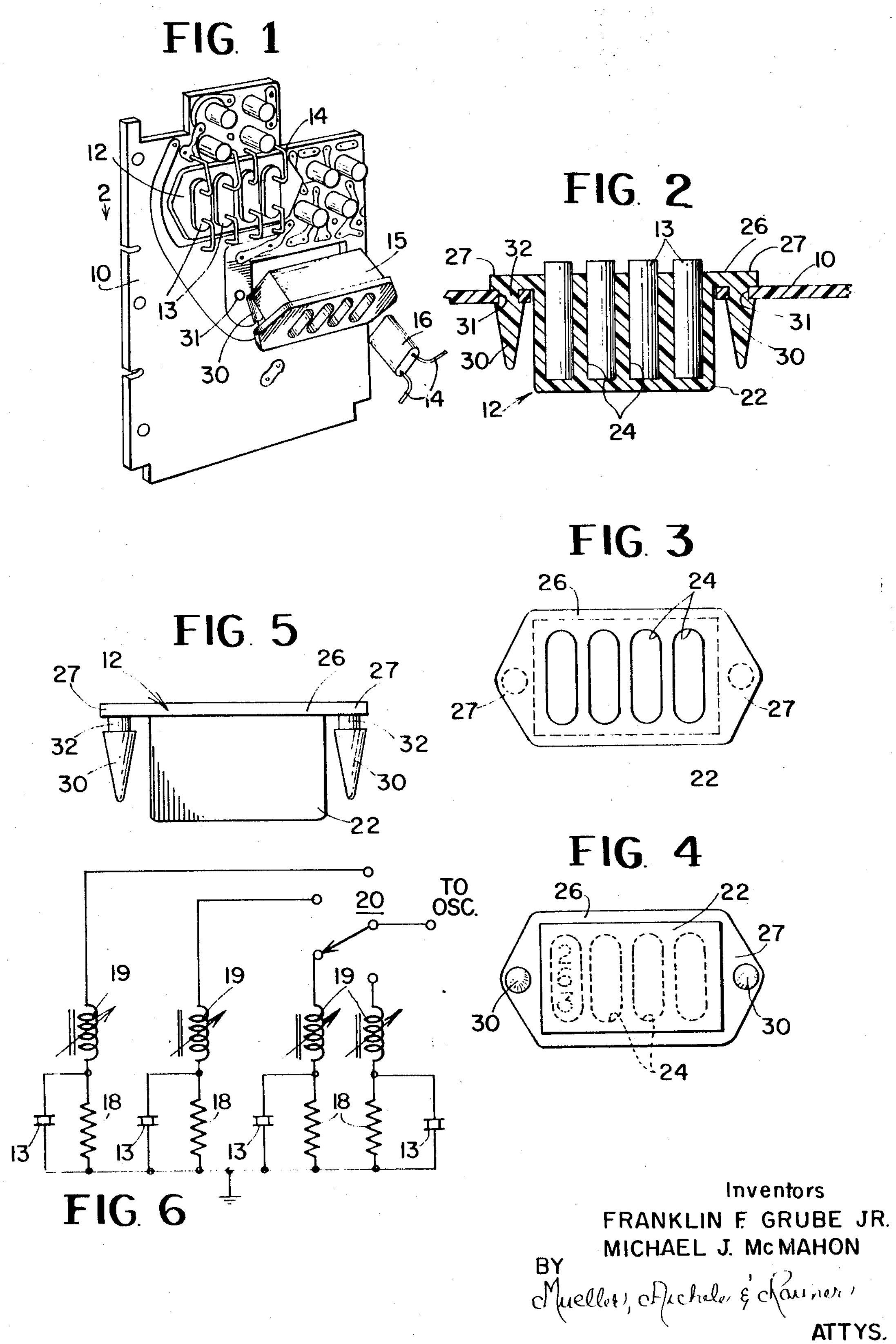
FIG. 1 illustrates the mounting support of the invention used to support piezoelectric crystal devices on a chassis.
FIG. 2 is a cross-sectional view of the mounting structure, chassis and supported devices.
FIG. 3 is a top view of the mounting structure.
FIG. 4 is a bottom view of the mounting structure.
FIG. 5 is a side view of the mounting structure.
FIG. 6 illustrates a circuit for connecting the piezoelectric crystal devices on the mounting support.

Referring now to the drawings, FIG. 1 shows a chassis 10 which may be a portion of the chassis for a radio transmitter and receiver. This chassis may be used with a portable radio transmitter and receiver which is subject to being dropped, and to shock vibrations from other causes. The radio transmitter and receiver is adapted to transmit and receive on four different frequencies, and four piezoelectric crystals are utilized in the transmitter to control the frequency transmitted, and four piezoelectric devices are used in the receiver to control the frequencies received. A first mounting support in accordance with the invention indicated by numeral 12 in FIG. 1 supports the four piezoelectric crystal devices 13 which control the receiver frequencies. Each device is provided in an enclosing can and has leads 14 extending therefrom. A second mounting support 15 is shown partially removed from the chassis and this is for supporting four piezoelectric devices for controlling the frequencies of the transmitter. One device 16 is illustrated in position to be inserted in the mounting structure 15.

As shown in FIG. 6, each piezoelectric crystal device 13 for the receiver is connected in parallel with a resistor 18, and in series with a coil 19 to a contact of switch 20. One side of each crystal is grounded and the switch 20 permits selective connection of the crystals to an oscillator for controlling the local oscillator frequency of the receiver, to thereby control the frequency of the signals received. The same circuit arrangement can be used in the transmitter to control the frequency of the signals transmitted.

FIGS. 2, 3, 4 and 5 show the construction of the mounting support 12. The support 15 in FIG. 1 can be of identical construction. The support is molded from a resilient material which may be silicone rubber. Silicone rubber has the desired strength and resiliency, and also may be transparent to permit inspection of identification markers on the devices supported, as will be described. The support includes a block 22, which is of generally rectangular configuration, having cavities 24 molded therein. An electrical device, such as a piezoelectric crystal in an enclosing can, is positioned in each of the cavities. A rim 26 extends from the block 22 about the side thereof in which the cavity openings are positioned. The rim extends further from the block at the ends to form tabs 27 for securing the support to the chassis. As shown in FIG. 2, the block 22 extends through an opening in the chassis 10, and the rim 26 of the support engages the edges of the opening.

For securing the support to the chassis, projections 30 are provided which extend from the tabs 27 through openings 31 in the chassis. The openings in the chassis are shown in FIGS. 1 and 2. The projections are conical with undercut portions 32 which provide an interlocking engagement with the chassis. The conical portions are compressed as they are inserted through the openings 31 in the chassis, and the undercut portions 32 are positioned in the openings and resist removal of the conical portions back through the openings. However, the conical portions can be compressed so that the supports can be removed from the chassis. In addition to the mounting provided by the resilient support, the wire leads 14 which connect the crystals to the circuit on the chassis 10 provide additional support. The connecting wire leads are flexible so that the crystals are resiliently mounted with respect to the chassis.

As previously stated, the resilient support can be molded of material which is transparent. This permits markings on the cans enclosing the crystals to be observed at the bottom of the support as indicated by the No. 263 in the device at the cavity to the left in FIG. 4. This may indicate the frequency of the crystal, or may be any other designation which may be desired. Color codes can be used to provide the designation and can be easily detected through the transparent support.

The support of the invention is seen to provide a resilient material about a substantial part of the devices supported thereby. In the structure shown, the depth of the cavity is substantially the same, or slightly greater than the largest dimension of the opening of the cavity. The cavity therefore forms a pocket for the device supported to securely mount the same. At the same time the resilient material between adjacent devices and the resilient mounting to the chassis isolates or protects the devices from shocks or vibrations which might be encountered by the chassis. The resilient wire connections likewise provide isolation from shock and vibration.

The support can be molded as a single integral unit with the block including the cavities, the rim, the mounting tabs and projections extending therefrom all being of the same material and produced by single molding operations. The support can be secured to the chassis without any other parts, such as rivets or eyelets, so that assembly is facilitated. The support may be used to contain the crystals prior to assembly to the chassis, and provides a convenient way of storing the same.

Although the support has been described for use with piezoelectric crystal devices; it will be apparent that it can be used for other devices and in particular devices which are of a fragile nature and subject to being damaged by vibration and shock encountered by the electrical equipment in which they are used.

We claim:

1. In electrical apparatus which is subject to shock and which has a frequency-controlling circuit, the combination including, a plurality of piezoelectric devices for controlling frequency, each device being provided in an elongated container and having conductors extending from one end thereof, a chassis for supporting electrical components and having an opening therein, and a support for said piezoelectric devices on said chassis for protecting such devices from shock encountered by said chassis including, a block of resilient silicone rubber having a plurality of cavities therein with openings for receiving said containers of said devices, said cavities being defined by walls of the resilient material and completely surrounding said containers except for said one end thereof, said block being positioned in said opening in said chassis and having partitions of the resilient material positioned between said devices in adjacent cavities, mounting portions of silicone rubber molded integrally with said block of material and extending on opposite sides from said block of material at one end thereof into engagement with said chassis, said mounting portions having projections extending therefrom in the direction of said block of material and said chassis having further openings spaced from said first named opening receiving said projections, said projections including portions having a cross section larger than said further openings and being compressible for insertion therein, and means connecting said conductors to said chassis, said mounting portions and said conductors providing a floating support for said piezoelectric devices for protecting the same from shock encountered by said chassis.

2. The combination of claim 1 wherein said block of resilient material is made of transparent material and wherein said containers have markings thereon visible through the transparent material.